(12) United States Patent
Park

(10) Patent No.: US 6,704,237 B2
(45) Date of Patent: Mar. 9, 2004

(54) CIRCUITS FOR CONTROLLING INTERNAL POWER SUPPLY VOLTAGES PROVIDED TO MEMORY ARRAYS BASED ON REQUESTED OPERATIONS AND METHODS OF OPERATING

(75) Inventor: Min-Sang Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/353,497

(22) Filed: Jan. 29, 2003

(65) Prior Publication Data
US 2004/0013024 A1 Jan. 22, 2004

(30) Foreign Application Priority Data

Jul. 18, 2002 (KR) .............................. 10-2002-0041950

(51) Int. Cl.[7] ................................................. G11C 7/00
(52) U.S. Cl. ................. 365/226; 365/189.09; 365/194; 365/230.03
(58) Field of Search ........................... 365/226, 230.03, 365/189.09, 194

(56) References Cited

U.S. PATENT DOCUMENTS 5,535,169 A * 7/1996 Endo et al. ............ 365/230.03
6,195,306 B1 * 2/2001 Horiguchi et al. .......... 365/226
6,496,438 B2 * 12/2002 Saito .......................... 365/226

* cited by examiner

Primary Examiner—Richard Elms
Assistant Examiner—Pho M. Luu
(74) Attorney, Agent, or Firm—Myers Bigel Sibley & Sajovec, P.A.

(57) ABSTRACT

An integrated circuit memory device includes a plurality of banks of a memory array and a power line connected to the plurality of banks. A plurality of internal voltage generating circuits are connected in parallel to the power line and are configured to provide internal voltage to the plurality of banks. A control circuit is connected to the plurality of internal voltage generating circuits and is configured to provided the internal voltage to more than one of the plurality of banks during a requested operation performed by fewer than all of the plurality of banks.

37 Claims, 5 Drawing Sheets

US 6,704,237 B2

CIRCUITS FOR CONTROLLING INTERNAL POWER SUPPLY VOLTAGES PROVIDED TO MEMORY ARRAYS BASED ON REQUESTED OPERATIONS AND METHODS OF OPERATING

CLAIM FOR PRIORITY

This application claims priority to Korean Patent Application No. 2002-41950, filed on Jul. 18, 2002, the entire contents of which are incorporated herein by reference.

FIELD OF THE INVENTION

The present invention is related to the field of integrated circuit devices and methods of operating in general, and more particularly, to integrated circuit memory devices and operations thereof.

BACKGROUND

As is well known, integrated circuits, such as semiconductor memory devices, can include an array of memory cells as a region for storing information. In order to provide stable read/write operations, an internal power supply voltage (hereinafter, referred to as an internal power supply voltage for the array) is supplied to the array of memory cells in addition to an internal power supply voltage supplied to a peripheral circuit. The internal power supply voltage for the array can be obtained using a circuit for converting an external power supply voltage, which is referred to as an internal voltage generating circuit. The internal voltage generating circuit can be implemented using a differential amplifier and a driver, as is well known to those skilled in the art.

The array of memory cells, in general, can be separated into a plurality of banks that operate independently. The banks can be supplied with the internal power supply voltage for the array via a single power line. A semiconductor memory device can include internal voltage generating circuits corresponding to each of the banks. The internal voltage generating circuits are commonly connected to a single power line so as to output an internal power supply voltage for each of the respective arrays. The internal voltage generating circuits can be controlled so as to operate simultaneously or selectively.

According to FIG. 1, an array of memory cells is formed of four banks and four internal voltage generating circuits are provided to correspond to each of the respective banks. Furthermore, according to FIG. 1, only one of the internal voltage generating circuits operates at one time. In particular, the corresponding internal voltage generating circuit will operate when the corresponding signal (IVC_Active_A, IVC_Active_B, IVC_Active_C, and IVC_Active_D) is activated. As a row of a selected bank is activated, current is consumed by memory cells of the selected bank. With current consumption, an internal power supply voltage Vint for an array becomes can be reduced to less than a target voltage. The lowered internal power supply voltage Vint for the array can be restored (i.e., increased) to the target voltage via an internal voltage generating circuit, which is controlled by the corresponding active signal. For example, as shown in FIG. 1, when IVC_Active_A is activated, Vint is reduced during period "T1" in FIG. 1. After the lowered internal power supply voltage Vint for the array is restored to the target voltage (period "T2"), the internal voltage generating circuit can continue to operate. Accordingly, current may be unnecessarily consumed during the period T2 in FIG. 1 due to the prolonged operation of the memory cells and the internal voltage generating circuit.

The period T1 in FIG. 1 may be shortened by operating all internal voltage generating circuits simultaneously. That is, as illustrated in FIG. 2, as active signals IVC_Active_A, IVC_Active_B, IVC_Active_C, and IVC_Active_D for activating corresponding internal voltage generating circuits are all activated, an internal power supply voltage for the array, which is lowered by row activation in a selected bank, can be more quickly restored to the target voltage. It will be understood that a period denoted by T3 in FIG. 2 is shorter than that denoted by T1 in FIG. 1. However, since all internal voltage generating circuits may only continue to operate after restoration of the internal power supply voltage for the array to the target voltage, current may be unnecessarily consumed for a period T4 which is even longer the period T2 shown in FIG. 1.

With need for a low-voltage and low-power memory device, recently, a new circuit and technique for reducing current consumption may be useful in semiconductor memory devices.

SUMMARY

Embodiments according to the present invention can provide internal voltages to memory arrays. Pursuant to these embodiments, an integrated circuit memory device includes a plurality of banks of a memory array and a power line connected to the plurality of banks. A plurality of internal voltage generating circuits are connected in parallel to the power line and are configured to provide internal voltage to the plurality of banks. A control circuit is connected to the plurality of internal voltage generating circuits and is configured to provided the internal voltage to more than one of the plurality of banks during a requested operation performed by fewer than all of the plurality of banks.

In some embodiments according to the present invention, the control circuit can include a bank selector circuit that is configured to select ones of the plurality of banks to receive the internal voltage and a pulse generator circuit, connected to the bank selector circuit, that is configured to generate an enable pulse for an activation time period responsive to the selection of the at least one of the plurality of banks. A plurality of internal voltage generating enable circuits is connected to the pulse generator circuit and the bank selector circuit and is configured to enable all of the plurality of internal voltage generating circuits for the activation time period.

In some embodiments according to the present invention, the plurality of internal voltage generating enable circuits are configured to disable ones of the plurality of internal voltage generating circuits not needed to complete the requested operation after the activation time period elapses.

In some embodiments according to the present invention, the pulse generator circuit includes an OR gate having a plurality of inputs connected to the bank selector circuit and that is configured to provide an output therefrom, a delay circuit connected to the OR gate and that is configured to delay the output of the OR gate for the activation timer period to an output of the delay circuit, an inverter circuit that is connected to the delay circuit and is configured to invert the output of the delay circuit at an output of the inverter circuit, and an AND gate, that is connected to the output of the OR gate and to the output of the inverter circuit, and is configured to provide the enable pulse responsive to the selection by the bank selector circuit.

In some embodiments according to the present invention, the requested operation is a read or write operation to a location in one of the plurality of banks. In some embodiments according to the present invention, the activation time period is a time that is sufficient to restore the internal voltage to a tar get voltage.

In some embodiments according to the present invention, the control circuit provides the internal voltage to more than one of the plurality of banks based address information and control information. In some embodiments according to the present invention, the control circuit further provides the internal voltage to the selected one of the plurality of banks for a requested operation time period and provides the internal voltage to remaining plurality of banks for an activation time period that is less than the requested operation time period.

In some embodiments according to the present invention, the requested operation time period is a time that is sufficient to complete the requested operation to the selected one of the plurality of banks. In some embodiments according to the present invention, the control circuit further provides the internal voltage to all of the plurality of banks if the requested operation is performed by all of the plurality of banks.

In accordance with one aspect of the present invention, there is provided a semiconductor memory device which includes a plurality of banks each of which includes a plurality of memory cells each storing data. A power line transfers an internal power supply voltage to be supplied in common to the banks. A plurality of internal voltage generating circuits are connected in common to the power line and supply the internal power supply voltage to the power line, respectively. A control circuit controls activation of the internal voltage generating circuits in response to bank and command information. When one of the banks is selected, the control circuit makes internal voltage generating circuits corresponding to unselected banks be inactivated after the internal voltage generating circuits are simultaneously activated and a predetermined time elapses. When the banks are all selected, the control circuit makes the internal voltage generating circuits be activated until a bank operation is completed.

In a case where the memory cells are DRAM cells, the predetermined time is an active restore time of the DRAM cells. Alternatively, the predetermined time is 80% of an active restore time of the DRAM cells.

DESCRIPTION OF EMBODIMENTS ACCORDING TO THE INVENTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Although the embodiments according to the invention are disclosed herein as having elements that are "connected" to one another, it will be understood that such disclosed elements may be directly connected to one another or connected to one another through intervening elements. Each embodiment described herein includes its complementary conductivity type embodiment as well.

Figure 1:
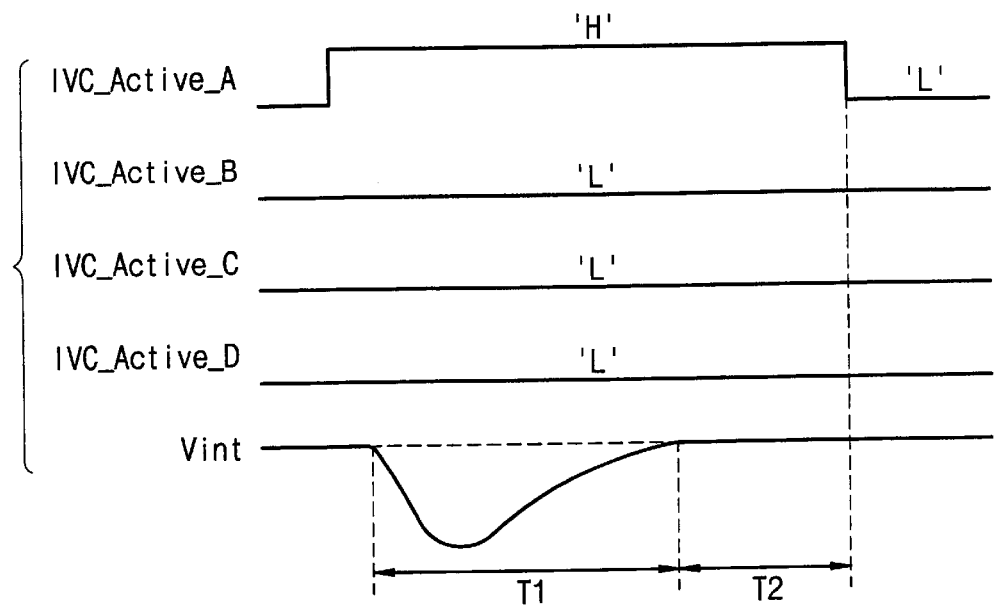
FIG. 1 shows variation of an internal power supply voltage when an internal voltage generating circuit corresponding to one bank operates.
Figure 2:
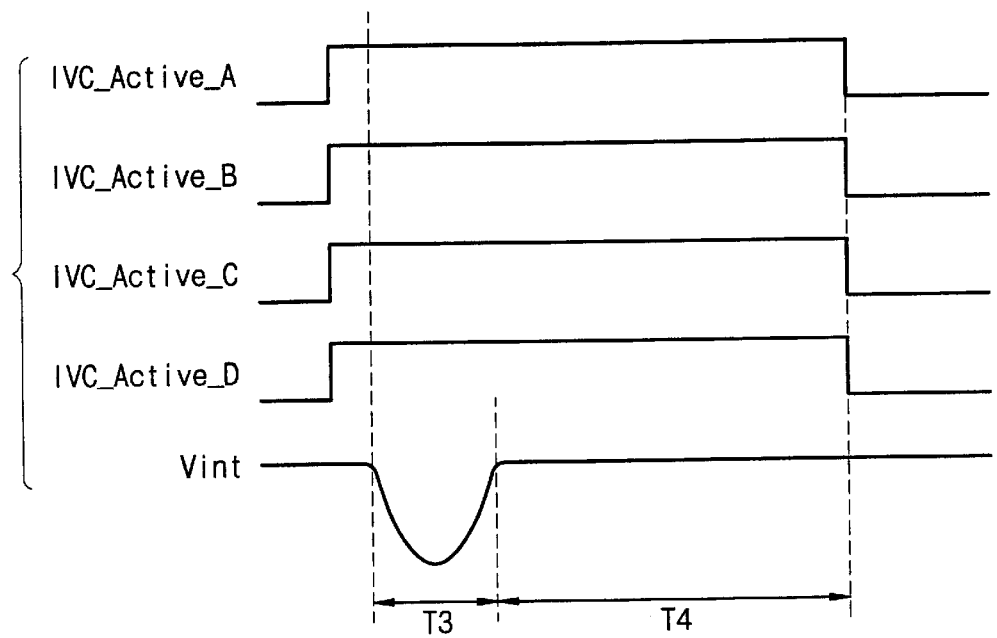
FIG. 2 shows variation of an internal power supply voltage when all internal voltage generating circuits each corresponding to four banks operate.
Figure 3:
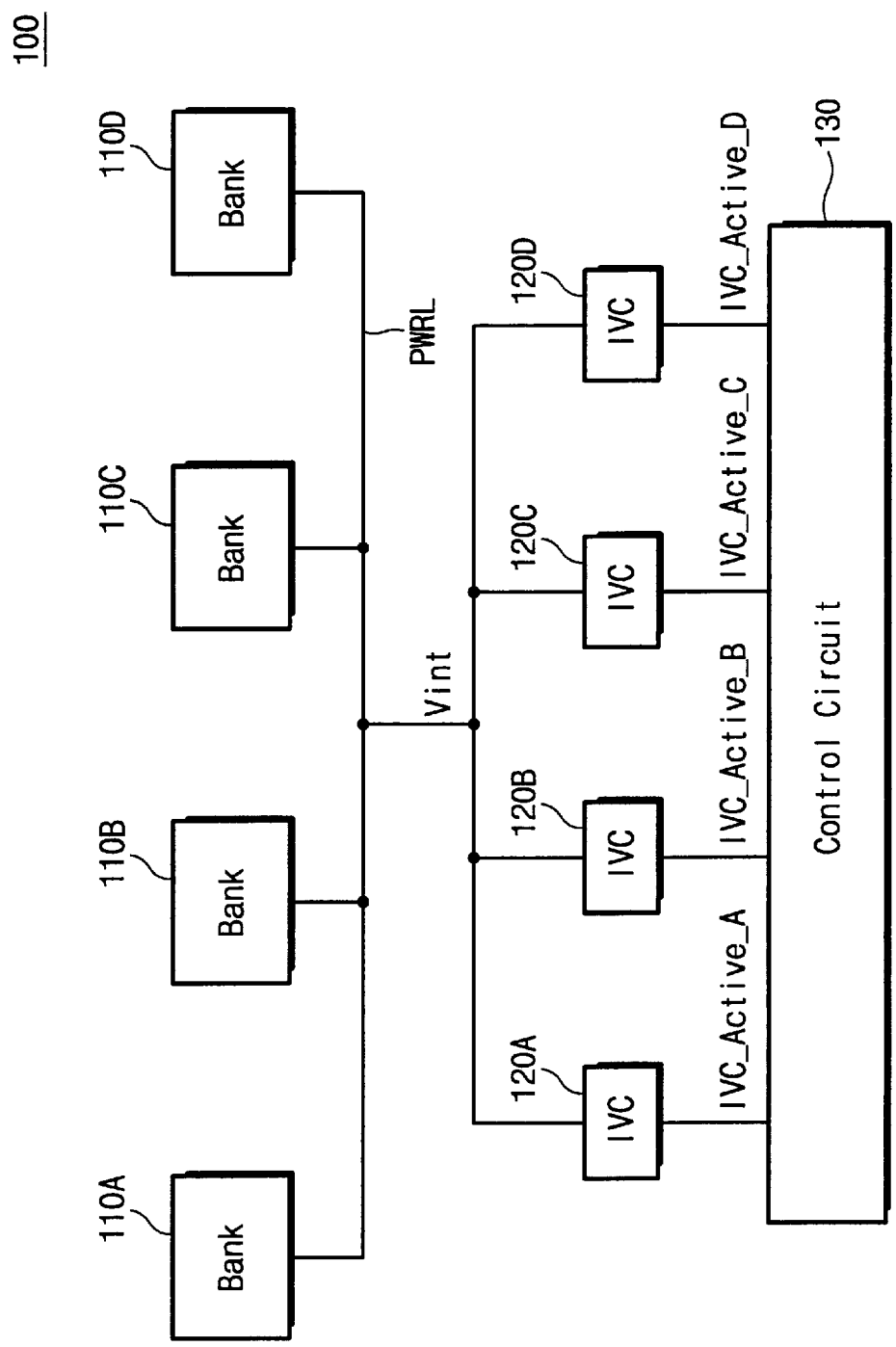
FIG. 3 is a block diagram illustrating semiconductor memory device embodiments according to the present invention.

FIG. 3 is a block diagram of a semiconductor memory device according to the present invention. Referring to FIG. 3, a semiconductor memory device 100 can be a dynamic random access memory (DRAM) device. However, it will be understood to those skilled in the art that the present invention can be applied to other types of memory devices, for example, SRAM, FRAM, flash memory, ROM, and so on.

The semiconductor memory device 100 includes a memory cell array as a region for storing data information. In some embodiments according to the present invention, the memory cell array is divided into four banks 110A, 110B, 110C, and 110D. Although not shown in the figures, it will be understood that the semiconductor memory device 100 can include data read/write circuits (e.g., a row selector, a column selector, a sense amplifier circuit, and so on) for reading/writing data from/to memory cells in each of the banks 110A, 110B, 110C, and 110D. Each of the banks 110A, 110B, 110C, and 110D is supplied with an internal power supply voltage for the array (Vint) via a power line PWRL. Internal voltage generating circuits 120A, 120B, 120C, and 120D are each connected in common to the power line PWRL. For example, as shown in FIG. 3, in some embodiments according to the present invention, the internal voltage generating circuits 120A, 120B, 120C, and 120D can be connected to the power line PWRL in parallel with one another. The internal voltage generating circuits 120A, 120B, 120C, and 120D operate responsive to corresponding active signals IVC_Active_A, IVC_Active_B, IVC_Active_C, and IVC_Active_D from a control circuit 130, respectively.

Continuously referring to FIG. 3, the control circuit 130 can operate responsive to bank information and command information. In embodiments according to the present invention where only one bank operates, for example during a read or write operation, the control circuit 130 enables the internal voltage generating circuits 120A–120D to operate simultaneously upon activation of a row. After an active restore time elapses, the control circuit 130 enables only the internal voltage generating circuit that corresponds to the selected bank. Herein, the active restore time is defined as a time sufficient for Vint to be restored to a target voltage. In some embodiments according to the present invention, the active restore time can be about 80% of the active restore time described above.

In embodiments according to the present invention where all banks 120A–20D operate, for example during a refresh operation, the control circuit 130 enables all the internal voltage generating circuits 120A–120D operate simultaneously until a required operation (e.g., the refresh operation) is completed.

Therefore, in some embodiments according to the present invention, activation of the internal voltage generating circuits 120A–120D is variably controlled based on how the banks operate. Accordingly, an internal power supply voltage for the array, which can be lowered by row activation, may be more quickly restored, thereby allowing a reduction in current consumption.

Figure 4:
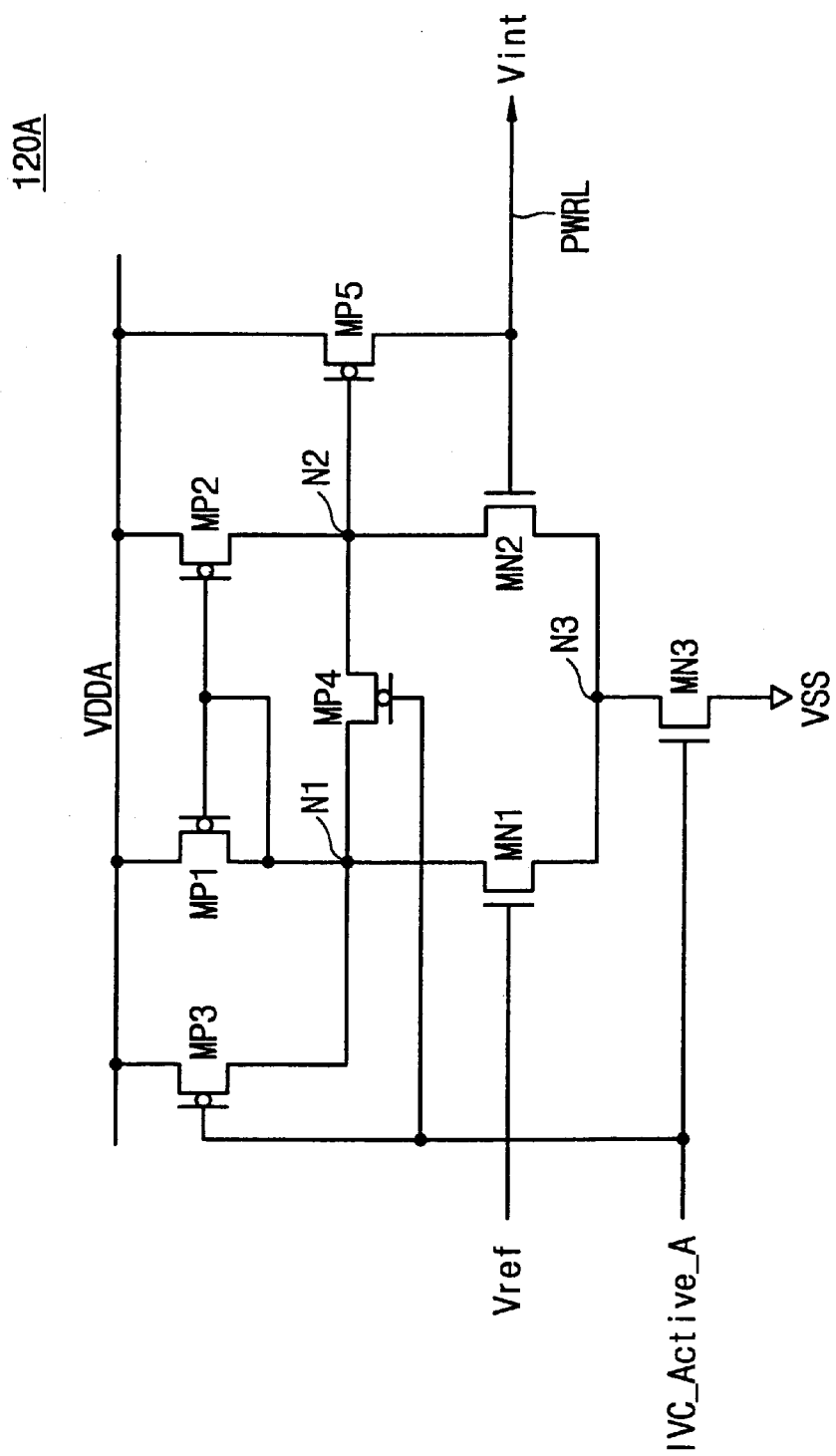
FIG. 4 is a schematic diagram illustrating embodiments of internal voltage generating circuits illustrated in FIG. 3.

Referring to FIG. 4 which shows one (e.g., 120A) of the internal voltage generating circuits 120A–120D illustrated in FIG. 3, an internal voltage generating circuit 120A includes Five PMOS transistors MP1, MP2, MP3, MP4, and MP5 and three NMOS transistors MN1, MN2, and MN3. Sources of the PMOS transistors MP1 and MP2 are connected to an external power supply voltage VDDA, respectively. The PMOS transistor MP1 has its gate and drain connected to a node N1. A gate of the PMOS transistor MP2 is connected to a gate of the PMOS transistor MP1, and a drain of the PMOS transistor MP2 is connected to a node N2. The NMOS transistor MN1, whose gate is connected to a reference voltage Vref, has its drain connected to the node N1 and its source connected to a node N3. The NMOS transistor MN2 whose gate is connected to a power line PWRL has its drain connected to the node N2 and its source connected to the node N3. The NMOS transistor MN3 has its drain connected to the node N3, its source connected to a ground voltage VSS, and its gate connected to an active signal IVC_Active_A. The source and drain of PMOS transistor MP3 are connected to the external power supply voltage VDDA and the node N1 respectively, and operates responsive to the active signal IVC_Active_A. The source and drain of PMOS transistor MP4 are connected to the nodes N1 and N2 respectively, and operates responsive to the active signal IVC_Active_A. The PMOS transistor MP5 whose gate is connected to the node N2 has its source connected to the external power supply voltage VDDA and its drain connected to the power line PWRL.

Herein, the PMOS transistors MP1 and MP2 and the NMOS transistors MN1, MN2, and MN3 form a differential amplifier, and the PMOS transistor MP5 forms a driver that supplies current from the external power supply voltage VDDA to the power line PWRL in response to an output of the differential amplifier.

When the active signal IVC_Active_A is activated high, the PMOS transistors MP3 and MP4 are turned off and the NMOS transistor MN3 is turned on. The differential amplifier compares an internal power supply voltage for the array Vint with a reference voltage Vref. The driver supplies (or blocks) current from the external power supply voltage VDDA to the power line PWRL in response to the result of the comparison of the inputs to the differential amplifier. That is, when the active signal IVC_Active_A is activated high, the internal voltage generating circuit 120A operates normally. When the active signal IVC Active_A is inactivated low, the PMOS transistors MP3 and MP4 are turned on and the NMOS transistor MN3 is turned off. The node N2 has the external power supply voltage VDDA of a high level, so that the PMOS transistor MP5 acting as the driver is turned off. Thus when the active signal IVC_Active_A is inactive (e.g., low), unnecessary current may be blocked from flowing through driver MP5 to the array via PWRL thereby allowing a reduction in consumption of current.

Figure 5:
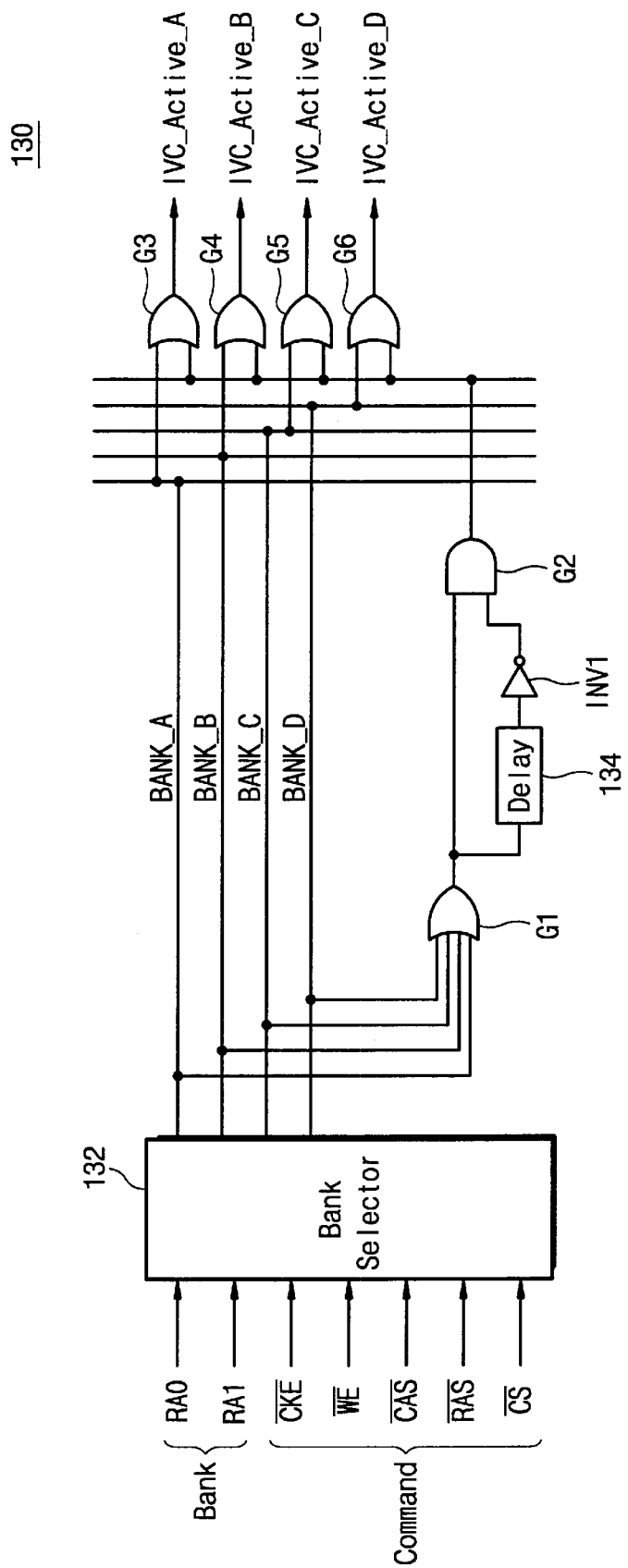
FIG. 5 is a schematic diagram illustrating embodiments of control circuits illustrated in FIG. 3.

FIG. 5 shows a control circuit according to embodiments of the present invention. A control circuit 130 includes a bank selector 132, five OR gates G1, G3, G4, G5, and G6, an AND gate G2, an inverter INV1, and a delay circuit 134, which are connected as illustrated in FIG. 5. The bank selector 132 generates bank select signals BANK_A, BANK_B, BANK_C, and BANK_D in response to bank information and command information. In embodiments according to the present invention, the bank information includes address signals RA0 and RA1, and the command information includes control signals CKE,/WE, /CAS, /RAS, and /CS. In embodiments where only one bank is selected, for example during a read or write operation, the bank selector 132 activates one of the bank select signals BANK_A, BANK_B, BANK_C, and BANK_D in response to the address signals RA0 and RA1 as the bank information. In embodiments where all banks are selected, for example during a refresh operation, the bank selector 132 activates all the bank select signals BANK_A, BANK_B, BANK_C, and BANK_D in response to the control signals /CKE, /WE, /CAS, /RAS, and /CS irrespective of the bank information.

The bank select signals BANK_A, BANK_B, BANK_C, and BANK_D generated from the bank selector 132 are provided to the OR gate G1. The AND gate G2 receives a signal output from the OR gate G1 and a signal output from the OR gate G1 via the delay circuit 134 and the inverter INV1. An output of the AND gate G2 is provided to the input terminals of the OR gates G3–G6 used to generate the bank activation signals (IVC_Active_A, IVC_Active_B, IVC Active_C, and IVC_Active_D). Bank select signals BANK_A, BANK_B, BANK_C, and BANK_D are provided to another of the input terminals of the OR gates G3–G6, respectively.

In this embodiment, elements OR gate G1, delay circuit 134, inverter INV1, and AND gate G2 of the control circuit 130 act as a pulse generator that generates a pulse signal in response to the bank select signals BANK_A, BANK_B, BANK_C, and BANK_D. Elements G3–G6 of the control circuit 130 act as an active signal generator that generates the active signals IVC_Active_A, IVC_Active_B, IVC_Active_C, and IVC_Active_D in response to the pulse signal from the pulse generator.

Figure 6A:
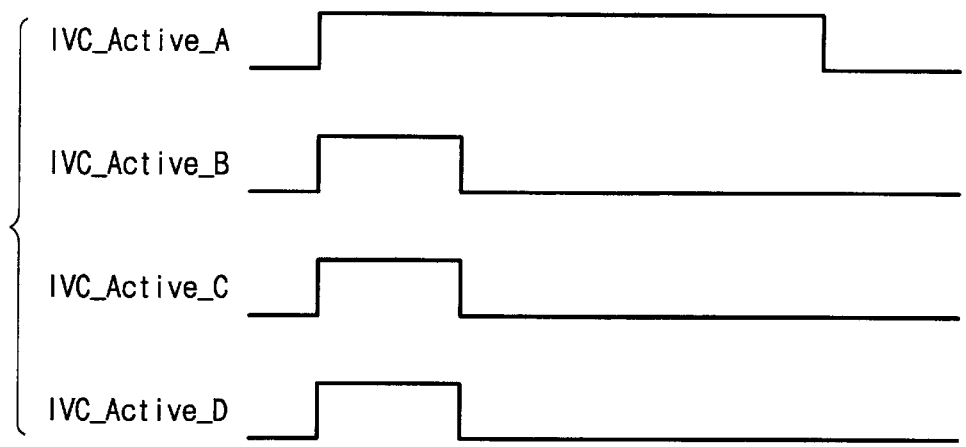
FIG. 6A is a waveform diagram illustrating method embodiments of internal voltage generating circuits in FIG. 3.
Figure 6B:
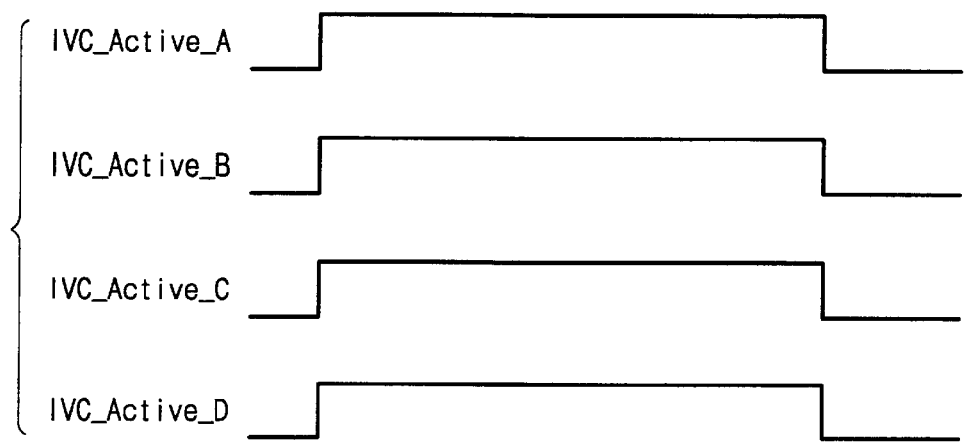
FIG. 6B is a waveform diagram illustrating method embodiments of internal voltage generating circuits in FIG. 3.

FIG. 6A shows waveforms of active signals where only one internal voltage generating circuit corresponding to one bank operates. FIG. 6B shows waveforms of active signals where all internal voltage generating circuits corresponding to four banks operate. Hereinafter, an operation of a semiconductor memory device according to the present invention will be described with reference to accompanying drawings.

A bank selector 132 activates one (e.g., BANK_A) of bank select signals BANK_A, BANK_B, BANK_C, and BANK_D in response to address signals RA0 and RA1 and control signals /CKE, /WE, /CAS, /RAS, and /CS. An output of OR gate G1 transitions from low-to-high in response to activation of the bank select signal BANK_A. An output signal of AND gate G2 transitions from a low level to a high level depending upon the output of the OR gate G1. OR gates G3–G6 output active signals IVC_Active_A, IVC_Active_B, IVC_Active_C, and IVC_Active_D respectively as illustrated in FIG. 6A, irrespective of logic levels of the bank select signals BANK_A, BANK_B, BANK_C, and BANK_D.

NMOS transistors MN3 of the internal voltage generating circuits 120A, 120B, 120C, and 120D are turned on with activation of the active signals IVC_Active_A, IVC_Active_B, IVC_Active_C, and IVC_Active_D. This makes the internal voltage generating circuits 120A–120D supply current to the power line PWRL so that an internal power supply voltage for the array Vint (reduced by activation of the row activation) can be restored to a target voltage. When all internal voltage generating circuits operate, the internal power supply voltage for the array Vint is restored up to a target voltage more rapidly than when the voltage Vint is restored by one internal voltage generating circuit.

After a delay time of a delay circuit 134 elapses, an output signal of the AND gate G2 transitions from high level to low level. This makes the outputs of the OR gates G3–G6 be determined by the logic levels of the bank select signals BANK_A, BANK_B, BANK_C, and BANK_D. While the active signal IVC_Active_A continues to be activated, as shown in FIG. 6A, the other active signals IVC_Active_B, IVC_Active_C, and IVC_Active_D are inactivated (as only bank select signal BANK_A is activated as discussed above). Accordingly, internal voltage generating circuits 120B–120D do not operate beyond the delay provided by the delay circuit 143. Accordingly, in a case Where one bank is selected, Vint may be restored to the target voltage while reducing unnecessary current consumption owing to the internal voltage generating circuits 120B–120C that correspond to unselected banks.

In some embodiments according to the present invention where the bank selector 132 activates all bank select signals (BANK_A, BANK_B, BANK_C, and BANK_D) in response to the control signals (/CKE, /WE, /CAS, /RAS, and /CS), irrespective of the address signals RA0 and RA1 as the bank information, such as during a refresh operation. Output of the OR gates G3–G6 are activated depending upon corresponding bank select signals BANK_A, BANK_B, BANK_C, and BANK_D irrespective of the output of the AND gate G2, as illustrated in FIG. 6B. Activation of the bank select signals BANK_A, BANK_B, BANK_C, and BANK_D is maintained to complete the requested operation, such as a refresh operation.

As set forth above, activation of internal voltage generating circuits can be variably controlled based on the banks which are to be powered during a requested operation. For example, when fewer than all of the banks are needed to complete the requested operation (such as a read or write operation), power to the array can be provided by more than one driver for an active restore time. After the active restore time elapses, power to the array can be provided by the driver which is needed to complete the requested operation. Thus, an internal power supply voltage for the array, which is lowered by row activation, can be quickly restored to a target voltage, and unnecessary current consumption can be reduced.

The invention has been described using exemplary preferred embodiments. However, it is to be understood that the scope of the invention is not limited to the disclosed embodiment. On the contrary, it is intended to cover various modifications and similar arrangements. The scope of t he claims, therefore, should be accorded the broadest interpretation so as to encompass all such modifications and similar arrangements.

What is claimed is:

1. An integrated circuit memory device comprising:
a plurality of banks of a memory array;
a power line connected to the plurality of banks;
a plurality of internal voltage generating circuits connected in parallel to the power line and configured to provide internal voltage to the plurality of banks; and
a control circuit connected to the plurality of internal voltage generating circuits configured to provide the internal voltage to more than one of the plurality of banks at a start of a requested operation performed by fewer than all of the plurality of banks.

2. An integrated circuit memory device according to claim 1 wherein the requested operation comprises a read or write operation to a location in one of the plurality of banks.

3. An integrated circuit memory device according to claim 1 wherein the activation time period comprises a time that is sufficient to restore the internal voltage to a target voltage.

4. An integrated circuit memory device according to claim 1 wherein the control circuit provides the internal voltage to more than one of the plurality of banks based address information and control information.

5. An integrated circuit memory device according to claim 1 wherein the control circuit is further configured to provide the internal voltage to the selected one of the plurality of banks for a requested operation time period and to provide the internal voltage to remaining ones of plurality of banks for an activation time period that is less than the requested operation time period.

6. An integrated circuit memory device according to claim 5 wherein the requested operation time period comprises a time that is sufficient to complete the requested operation to the selected one of the plurality of banks.

7. An integrated circuit memory device according to claim 1 wherein the control circuit is further configured to provide the internal voltage to all of the plurality of banks if the requested operation is performed by all of the plurality of banks.

8. An integrated circuit memory device comprising:
a plurality of banks of a memory array;
a power line connected to the plurality of banks;
a plurality of internal voltage generating circuits connected in parallel to the power line and configured to provide internal voltage to the plurality of banks; and
a control circuit connected to the plurality of internal voltage generating circuits configured to provide the internal voltage to more than one of the plurality of banks during a requested operation performed by fewer than all of the plurality of banks, wherein the control circuit comprises:
a bank selector circuit configured to select ones of the plurality of banks to receive power;
a pulse generator circuit, connected to the bank selector circuit, configured to generate an enable pulse for an activation time period responsive to the selection of the at least one of the plurality of banks; and
a plurality of internal voltage generating enable circuits, connected to the pulse generator circuit and the bank selector circuit, configured to enable all of the plurality of internal voltage generating circuits for the activation time period.

9. An integrated circuit memory device according to claim 8 wherein the plurality of internal voltage generating enable circuits are configured to disable ones of the plurality of internal voltage generating circuits not needed to complete the requested operation after the activation time period elapses.

10. An integrated circuit memory device according to claim 8 wherein the pulse generator circuit further comprises:
an OR gate having a plurality of inputs connected to the bank selector circuit and configured to provide an output therefrom;
a delay circuit connected to the OR gate and configured to delay the output of the OR gate for the activation timer period to an output of the delay circuit;

an inverter circuit connected to the delay circuit and configured to invert the output of the delay circuit at an output of the inverter circuit; and an AND gate, connected to the output of the OR gate and the output of the inverter circuit, configured to provide the enable pulse responsive to the selection by the bank selector circuit.

11. A semiconductor memory device comprising:

a plurality of banks each of which includes a plurality of memory cells each storing data;

a power line which transfers an internal power supply voltage to be supplied in common to the banks;

a plurality of internal voltage generating circuits which are connected in common to the power line and each of which supplies the internal power supply voltage to the power line; and a control circuit which controls activation of the internal voltage generating circuits in response to bank and command information, wherein when one of the banks is selected, the control circuit makes internal voltage generating circuits corresponding to unselected banks be inactivated after the internal voltage generating circuits are simultaneously activated and a predetermined time elapses.

12. The semiconductor memory device according to claim 11, wherein the memory cells are DRAM cells.

13. The semiconductor memory device according to claim 12, wherein the predetermined time is an active restore time of the DRAM cells.

14. The semiconductor memory device according to claim 12, wherein the predetermined time is 80% of an active restore time of the DRAM cells.

15. The semiconductor memory device according to claim 11, wherein when the banks are all selected, the control circuit makes the internal voltage generating circuits be activated until a bank operation is completed.

16. A semiconductor memory device comprising:

a plurality of banks each of which includes a plurality of memory cells each storing data;

a power line which transfers an internal power supply voltage to be supplied in common to the banks;

a plurality of internal voltage generating circuits which are connected in common to the power line and generate the internal power supply voltage in response to corresponding active signals, respectively;

a bank selecting circuit which generates bank select signals for selecting the banks in response to bank and command information;

a pulse generating circuit which generates a pulse signal in response to the bank select signals; and an active signal generating circuit which generates the active signals in response to the bank select signals and the pulse signal, wherein when the command information indicates selection of one of the banks, active signals corresponding to unselected banks are inactivated after the active signals are simultaneously activated and a predetermined time elapses.

17. The semiconductor memory device according to claim 16, wherein the memory cells are DRAM cells.

18. The semiconductor memory device according to claim 17, wherein the predetermined time is an active restore time of the DRAM cells.

19. The semiconductor memory device according to claim 17, wherein the predetermined time is 80% of an active restore time of the DRAM cells.

20. The semiconductor memory device according to claim 16, wherein when the command information indicates selection of all the banks, the active signals are simultaneously activated and continue to be maintained at an active state until a bank operation is completed.

21. A semiconductor memory device comprising:

a plurality of banks each of which includes a plurality of memory cells each storing data;

a power line which transfers an internal power supply voltage to be supplied in common to the banks;

a plurality of internal voltage generating circuits which are connected in common to the power line and generate the internal power supply voltage in response to corresponding active signals, respectively; and a control circuit which generates the active signals in response to bank and command information, wherein the control circuit controls activation of the active signals so that the internal voltage generating circuit are simultaneously activated and so that internal voltage generating circuits corresponding to unselected banks are inactivated after a predetermined time elapses, during a read/write operation.

22. The semiconductor memory device according to claim 21, wherein the memory cells are DRAM cells.

23. The semiconductor memory device according to claim 22, wherein the predetermined time is an active restore time of the DRAM cells.

24. The semiconductor memory device according to claim 22, wherein the predetermined time is 80% of an active restore time of the DRAM cells.

25. The semiconductor memory device according to claim 21, wherein the control circuit makes the internal voltage generating circuits be activated until a bank operation is completed, during a refresh operation.

26. The semiconductor memory device according to claim 21, wherein the control circuit comprises:

a bank selector which generates bank select signals for selecting the banks in response to the bank and command information;

a pulse generator which generates a pulse signal in response to the bank select signals; and an active signal generator which generates the active signals in response to the bank select signals and the pulse signal.

27. A method of operating a semiconductor memory device which includes a plurality of banks each including a plurality of memory cells for storing data; and a plurality of internal voltage generating circuits for generating internal power supply voltages to be supplied in common to the banks, respectively, the method comprising the steps of:

simultaneously activating the internal voltage generating circuits when one of the banks is selected; and inactivating internal voltage generating circuits of unselected banks after a predetermined time elapses, wherein an internal voltage generating circuit of the selected bank is activated until a bank operation is completed.

28. The method according to claim 27, wherein in a case where the memory cells are DRAM cells, the predetermined time is an active restore time of the DRAM cells.

29. The method according to claim 27, wherein in a case where the memory cells are DRAM cells, the predetermined time is 80% of an active restore time of the DRAM cells.

30. The method according to claim 27, wherein when the banks are all selected, the internal voltage generating circuits are activated until the bank operation is completed.

31. A method for providing internal voltages in an integrated circuit memory device, the method comprising the step of providing an internal voltage to more than one of a plurality of banks of memory during a requested operation performed by fewer than all of the plurality of banks, further comprising:

provide the internal voltage to a selected one of the plurality of banks that performs the requested operation for a requested operation time period.

32. A method according to claim 31 further comprising the step of:

providing the internal voltage to remaining ones of the plurality of banks that do not perform the requested operation for an activation time period that is less than the requested operation time period.

33. A method according to claim 31 wherein the requested operation time period comprises a time that is sufficient to complete the requested operation to the selected one of the plurality of banks.

34. A method according to claim 31 further comprising the step of:

providing the internal voltage to all of the plurality of banks if the requested operation is performed by all of the plurality of banks.

35. An integrated circuit memory device comprising:

a plurality of banks of a memory array;

a power line connected to the plurality of banks;

a plurality of internal voltage generating circuits connected in parallel to the power line and configured to provide internal voltage to the plurality of banks; and a control circuit connected to the plurality of internal voltage generating circuits configured to activate the internal voltage to more than one of the plurality of banks at a start of a requested operation performed by a single one of the plurality of banks.

36. An integrated circuit memory device according to claim 35 wherein the control circuit is further configured to deactivate all but the single one of the plurality of banks after the start of the requested operation.

37. An integrated circuit memory device according to claim 35 wherein the control circuit is further configured to activate the internal voltage to more than one of the plurality of banks substantially simultaneously at the start.

* * * * *